(12) United States Patent
Kim et al.

(10) Patent No.: US 8,691,371 B2
(45) Date of Patent: Apr. 8, 2014

(54) BARRIER COATING AND METHOD

(75) Inventors: Tae Won Kim, San Jose, CA (US); Min Yan, Ballston Lake, NY (US); Ahmet Gun Erlat, Clifton Park, NY (US); Thomas Bert Gorczyca, Schenectady, NY (US); Christian Maria Anton Heller, Albany, NY (US); Paul Alan McConnelee, Schenectady, NY (US); Marc Schaepkens, Medina, OH (US)

(73) Assignee: General Electric Company, Schenectady, NY (US)

(*) Notice: Subject to any disclaimer, the term of this patent is extended or adjusted under 35 U.S.C. 154(b) by 1593 days.

(21) Appl. No.: 11/828,543

(22) Filed: Jul. 26, 2007

(65) Prior Publication Data

US 2008/0299384 A1 Dec. 4, 2008

Related U.S. Application Data

(63) Continuation-in-part of application No. 10/879,468, filed on Jun. 30, 2004, now Pat. No. 7,449,246, and a continuation-in-part of application No. 10/988,481, filed on Nov. 15, 2004, and a continuation-in-part of application No. 10/439,506, filed on May 15, 2003, now abandoned, and a continuation-in-part of application No. 10/779,373, filed on Feb. 17, 2004, and a continuation-in-part of application No. 10/065,018, filed on Sep. 11, 2002, now Pat. No. 7,015,640, and a continuation-in-part of application No. 11/398,724, filed on Apr. 6, 2006, now Pat. No. 7,397,183.

(51) Int. Cl.
*B32B 7/02* (2006.01)

(52) U.S. Cl.
USPC .................. 428/216; 428/336; 428/451

(58) Field of Classification Search
USPC ........................... 428/216, 336, 451
See application file for complete search history.

(56) References Cited

U.S. PATENT DOCUMENTS

| | | | |
|---|---|---|---|
| 4,861,671 A | 8/1989 | Muchnik et al. |
| 5,051,308 A | 9/1991 | Reed et al. |
| 5,510,140 A | 4/1996 | Kurose et al. |
| 5,643,638 A | 7/1997 | Otto et al. |
| 5,736,207 A | 4/1998 | Walther et al. |
| 6,300,040 B1 | 10/2001 | Lewis |
| 6,492,026 B1 | 12/2002 | Graff et al. |
| 6,537,688 B2 | 3/2003 | Silvernail et al. |

(Continued)

FOREIGN PATENT DOCUMENTS

| | | |
|---|---|---|
| JP | 11129423 A | 5/1999 |
| WO | WO9839497 A1 | 9/1998 |
| WO | WO03087247 A1 | 10/2003 |

OTHER PUBLICATIONS

Hoshimoto et al., "Properties of PECVD SiOxNy Films as Selective Diffusion Barrier", J. Electrochem. Soc.: Solid-State Science & Technology, vol. 13, No. 7, pp. 1464-1467, Jul. 1986.

(Continued)

*Primary Examiner* — D. S. Nakarani
(74) *Attorney, Agent, or Firm* — Jean K. Testa; Fletcher Yoder, P.C.

(57) ABSTRACT

A barrier coating for a composite article is provided. The barrier coating includes an organic zone; an inorganic zone; and an interface zone between the organic zone and the inorganic zone.

29 Claims, 11 Drawing Sheets

(56) References Cited

U.S. PATENT DOCUMENTS

| | | |
|---|---|---|
| 6,573,652 B1 | 6/2003 | Graff |
| 6,614,057 B2 | 9/2003 | Silvernail et al. |
| 6,664,137 B2 | 12/2003 | Weaver |
| 6,737,145 B1 | 5/2004 | Watanabe et al. |
| 6,737,753 B2 | 5/2004 | Kumar et al. |
| 6,911,667 B2 | 6/2005 | Pichler |
| 7,048,823 B2 | 5/2006 | Bermel |
| 7,229,703 B2 | 6/2007 | Kawashima |
| 7,399,991 B2 | 7/2008 | Seo et al. |
| 7,531,243 B2 | 5/2009 | Naruse |
| 2002/0006487 A1* | 1/2002 | O'Connor et al. ........... 428/35.7 |
| 2003/0104753 A1 | 6/2003 | Graff et al. |
| 2003/0205845 A1 | 11/2003 | Pichler et al. |
| 2004/0031977 A1 | 2/2004 | Brown et al. |
| 2004/0046497 A1 | 3/2004 | Schaepkens et al. |
| 2004/0058157 A1 | 3/2004 | Ishikawa |
| 2004/0119068 A1 | 6/2004 | Weaver |
| 2004/0121146 A1 | 6/2004 | He et al. |
| 2004/0152390 A1 | 8/2004 | Chung et al. |
| 2004/0209126 A1 | 10/2004 | Ziegler et al. |
| 2004/0219380 A1 | 11/2004 | Naruse et al. |

OTHER PUBLICATIONS

Alayo et al., "On the Nitrogen and Oxygen Incorporation in Plasma-Enhanced Chemical Vapor Deposition (PECVD) SiOxNy Films", Thin Solid Films, vol. 402, pp. 154-161, 2002.

PCT International Search Report dated Aug. 28, 2007.

* cited by examiner

Substrate with a Planarizing Layer Coating

BARRIER COATING AND METHOD

CROSS REFERENCE TO RELATED APPLICATIONS

This application is a Continuation-In-Part of U.S. patent application Ser. No. 10/879,468, filed Jun. 30, 2004, now U.S. Pat. No. 7,449,246, and a Continuation-In-Part of U.S. patent application Ser. No. 10/988,481, filed Nov. 15, 2004, and a Continuation-In-Part of U.S. patent application Ser. No. 10/439,506, filed May 15, 2003, now abandoned, and a Continuation-In-Part of U.S. patent application Ser. No. 10/779,373, filed Feb. 17, 2004, now abandoned, and a Continuation-In-Part of U.S. patent application Ser. No. 10/065,018 filed Sep. 11, 2002, now U.S. Pat. No. 7,015,640, through co-pending divisional U.S. patent application Ser. No. 11/398,724 filed Apr. 6, 2006, and a Continuation-In-Part of U.S. patent application Ser. No. 11/398,724 filed Apr. 6, 2006, now U.S. Pat. No. 7,397,183, and which are incorporated by reference.

STATEMENT REGARDING FEDERALLY SPONSORED RESEARCH & DEVELOPMENT

This invention was made with Government support under contract number RFP01-63-GE awarded by United States Display Consortium and Army Research Laboratory. The Government has certain rights in the invention.

BACKGROUND

1. Technical Field

The invention includes embodiments that may relate to a coating. The invention includes embodiments that may relate to methods of making or using the coating.

2. Discussion of Related Art

Devices that are susceptible to reactive chemical species normally encountered in the ambient environment may require a protective coating. The surfaces of these devices as manufactured may not be atomically smooth and may have surface spikes. These surface spikes may be hundreds of nanometers high. Also, the exposed surfaces of these devices may be scratched and damaged during fabrication and/or transportation. These surface defects may limit the performance of these devices. A defect may allow contact between an anode and cathode and could lead to a short in the device. A pinhole in various functional coatings could allow the permeation of moisture, oxygen and possibly other deleterious materials.

It may be desirable to have a coating that differs from those coatings that are currently available. It may be desirable to have a method of making or using a coating that differs from those methods that are currently available.

BRIEF DESCRIPTION

In one embodiment, a barrier coating for a composite article is provided. The barrier coating includes an organic zone; an inorganic zone; and a transitional interface zone between the organic zone and the inorganic zone.

In one embodiment, a composite article is provided that includes a substrate; and a barrier coating secured to a surface of the substrate, and the barrier coating comprising a transitional interface zone between an organic zone and an inorganic zone.

In one embodiment, a method for depositing a barrier coating is provided. The method includes depositing a planarizing composition on a substrate surface; and depositing reaction products or recombination products of reacting species on a surface of the planarizing layer to form a barrier coating having an organic zone, an inorganic zone, and a interface zone.

BRIEF DESCRIPTION OF THE DRAWINGS

In the accompanying drawings like characters represent like parts throughout.

DETAILED DESCRIPTION

Figure 1:
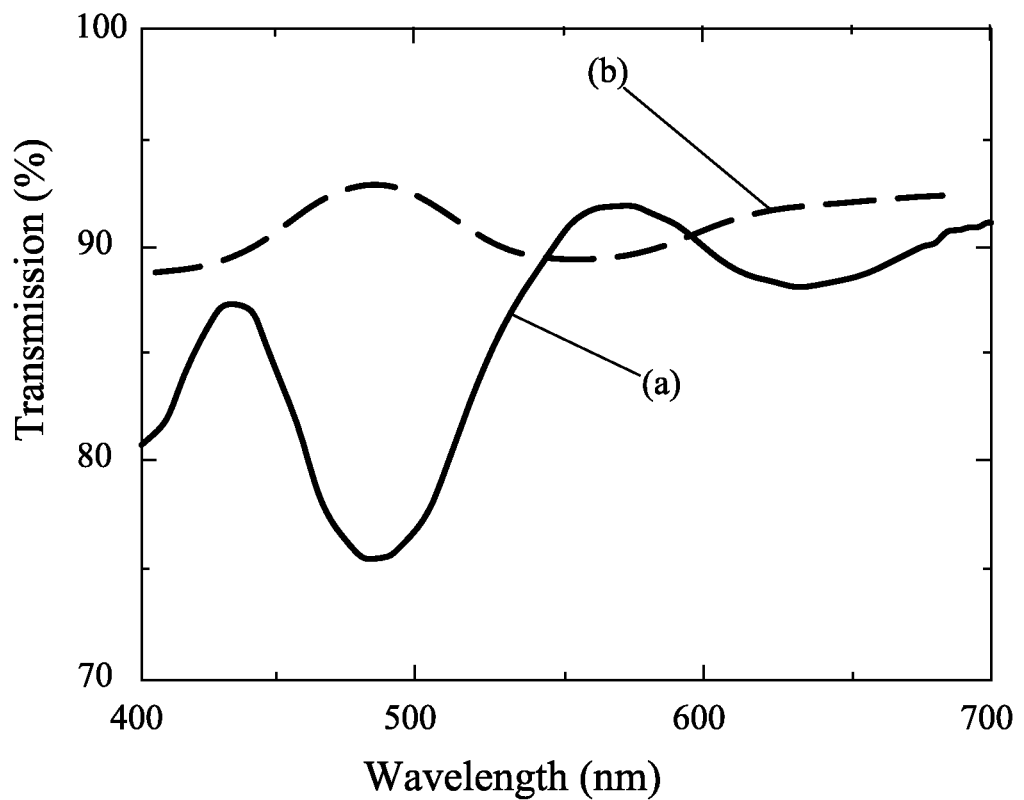
FIG. 1 graphically shows light transmittance through identical substrates having barrier coatings with and without refractive index matching.

The invention includes embodiments that may relate to a coating. The invention includes embodiments that may relate to methods of making or using the coating.

Light emitting and light absorbing materials and electrode materials in optoelectronic devices may be susceptible to attack by reactive species existing in the environment. Such reactive species may include oxygen, water vapor, hydrogen sulfide, SOx, NOx, solvents, and the like. Barrier coatings engineered to affect light transmission only to a small extent extend the device lifetime without degrading the overall device efficiency. Desirable barrier properties may be achieved by using an organic-inorganic composition and desirable light transmission is achieved by matching refractive indices of inorganic zones and organic zones in the coating.

Approximating language, as used herein throughout the specification and claims, may be applied to modify any quantitative representation that could permissibly vary without resulting in a change in the basic function to which it may be about related. Accordingly, a value modified by a term such as "about" is not limited to the precise value specified. In some instances, the approximating language may correspond to the precision of an instrument for measuring the value.

The term "organic" means the composition is over 90% organic. The term "inorganic" means the composition is over 90% inorganic. The term "average surface roughness" $R_a$ is defined as the integral of the absolute value of the roughness profile measured over an evaluation length. The term "peak surface roughness" $R_p$ is the height of the highest peak in the roughness profile over the evaluation length. The term "smooth" means the average surface roughness $R_a$ is less than about 4 nanometers and the peak surface roughness $R_p$ is less than about 10 nanometers. Defect free means the number of point defects is less than about 100/mm². "Perpendicular" means within 15 degrees either side of a perpendicular to a tangent drawn at any point on the surface. "Uniform refractive index" means the refractive index of any layer in the coating is within 10% of any other layer in the coating for a selected wavelength. "Uniform light transmission" means at a selected wavelength in a selected wavelength range, the transmission is within 10% of the average light transmission for the wavelength range; in other words, the barrier coating does not differentially attenuate wavelengths within the selected wavelength range. The term "transparent" means allowing a total transmission of at least about 75 percent.

In one embodiment, a composite article includes a barrier coating disposed on a surface. The barrier coating may have optical properties that are uniform along an axis of light transmission oriented perpendicular to the surface of the coating. A coating with a uniform refractive index throughout its thickness may result in a controlled and uniform set of optical properties. The barrier coating may preserve color neutrality by exhibiting uniform light transmission.

The barrier coating may be constructed with zones of various compositions, and with varying composition ratios over thickness. The composition selection, zone arrangement, zone number, thickness, zone thickness, zone composition gradient delta, and method of application of the barrier coating are factors that may affect the optical properties, and the barrier properties. For example, depositing uniform refractive-index materials with a selected interface from material to material may overcome or reduce optical loss due to interference resulting from differing refractive indices of the layers or zones of the compositions. Further, the desired transmissivity may be achieved by matching the refractive indices of layers or zones in the coating. Thus, the optical properties, which are effectible by selection of the factors, can be controlled to reduce or eliminate differentially attenuated wavelengths of light (electromagnetic radiation), direct the angle of the axes of light transmission with regard to the plane of the coating for differing wavelengths, and increase or maintain the overall light transmissivity.

A performance parameter in an optoelectronic device is optical efficiency. The barrier coating according to an embodiment of the invention is transparent. For transparency, the selected wavelength range can be in the visible region, the infrared region, the ultraviolet region or combinations thereof. For example, a 100 micrometer-thick nylon or polycarbonate substrate having the barrier coating secured to a surface, light transmittance along the axis of light transmission is greater than 85% for all wavelengths in the visible light wavelength region about 400 nanometers to about 700 nanometers.

FIG. 1 compares the visible light transmittance through a substrate with a barrier coating without refractive index matching (a) with a refractive index matched barrier coating (b). A transmissivity is shown that is greater than 85% for the visible wavelength with no large amplitude interference fringes for the barrier coating. Therefore the refractive-index matched barrier coating is desirably transparent in the visible wavelength range.

The barrier coating of one embodiment includes at least one transparent inorganic zone and at least one transparent organic zone, and the barrier coating itself has a low permeability of oxygen, water, or other reactive materials present in the environment.

Figure 2:
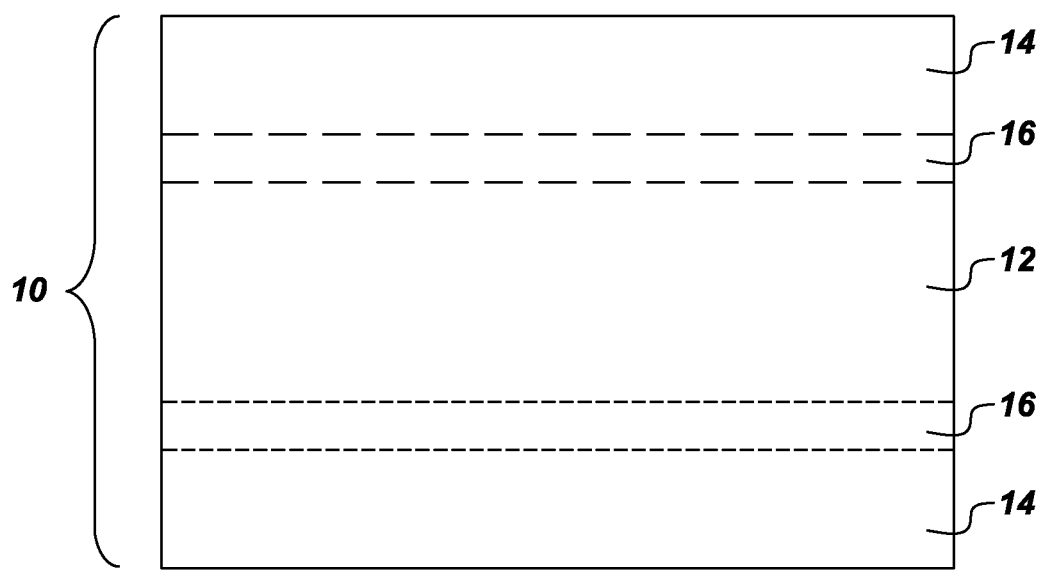
FIG. 2 shows schematically an embodiment of a barrier coating.

The drawings describe an embodiment and do not limit the invention. FIG. 2 shows an organic zone 12, an inorganic zone 14 and an organic-inorganic interface zone 16.

Although, any number of zones can be present in the barrier coating, at least an organic zone and an inorganic zone may be suitable for reducing the permeation rate of moisture, oxygen, or another reactive species. If more than two inorganic zones are present in the barrier coating, the intervening organic zone may serve to decouple defect or crack propagation from one inorganic zone to another. In one embodiment, only the inorganic zone approaches 100 percent purity (that is, for the inorganic zone, an absence of organic material or of material that forms the organic zone).

An average thickness of respective organic zones is in a range of from about 100 nanometers to about 1 micrometer. In one embodiment, the thickness is greater than 100 nanometers. In one embodiment, the thickness is less than 1 micrometer. In another embodiment, the thickness is in a range of from about 100 nanometers to about 200 nanometers, from about 200 nanometers to about 300 nanometers, from about 300 nanometers to about 400 nanometers, from about 400 nanometers to about 500 nanometers, from about 500 nanometers to about 600 nanometers, from about 600 nanometers to about 700 nanometers, from about 700 nanometers to about 800 nanometers, from about 800 nanometers to about 900 nanometers, or from about 900 nanometers to about 1 micrometer.

An average thickness of respective inorganic zones is in a range of from about 10 nanometers to about 100 nanometers. In one embodiment, the thickness is greater than 10 nanometers. In one embodiment, the thickness is less than 100 nanometers. In another embodiment, the thickness is in a range of from about 10 nanometers to about 20 nanometers, from about 20 nanometers to about 30 nanometers, from about 30 nanometers to about 40 nanometers, from about 40 nanometers to about 50 nanometers, from about 50 nanometers to about 60 nanometers, from about 60 nanometers to about 70 nanometers, from about 70 nanometers to about 80 nanometers, from about 80 nanometers to about 90 nanometers, or from about 90 nanometers to about 100 nanometers.

A thickness of respective interface zones is in a range of from about 5 nanometers to about 100 nanometers. In one embodiment, the thickness is greater than 5 nanometers. In one embodiment, the thickness is less than 30 nanometers. In another embodiment, the thickness is in a range of from about 5 nanometers to about 7 nanometers, from about 7 nanometers to about 9 nanometers, from about 9 nanometers to about 12 nanometers, from about 12 nanometers to about 14 nanometers, from about 14 nanometers to about 16 nanometers, from about 16 nanometers to about 18 nanometers, from about 18 nanometers to about 20 nanometers, from about 20 nanometers to about 25 nanometers, or from about 25 nanometers to about 30 nanometers. In another embodiment, the thickness is in a range of from about 30 nanometers to about 40 nanometers, from about 40 nanometers to about 50 nanometers, from about 50 nanometers to about 60 nanometers, from about 60 nanometers to about 70 nanometers, from about 70 nanometers to about 80 nanometers, from about 80 nanometers to about 90 nanometers, or from about 90 nanometers to about 100 nanometers.

In one embodiment, the organic zone is of uniform composition. In another embodiment, the organic zone is of a composition having components, the component concentration of which varies across the thickness of the layer to define a compositional gradient. In another embodiment, all organic zones in a barrier coating are of same composition as each other. In another embodiment, at least two of the organic zones are of different composition from each other. In one embodiment, the organic zone is substantially free of the material of the adjacent inorganic zone. In one embodiment, two organic zones of differing compositions are adjacent each other, or have a interface zone inbetween.

In one embodiment, the inorganic zone is of uniform composition. In another embodiment, the inorganic zone comprises a composition having components, the component concentration of which varies across the thickness of the layer to define a compositional gradient. In another embodiment, all inorganic zones in the barrier coating are of same composition as each other. In another embodiment, at least two of the inorganic zones are of different composition from each other. In one embodiment, the inorganic zone is free of the material of the adjacent organic zone. In one embodiment, two inorganic zones of differing compositions are adjacent each other, or have a interface zone inbetween.

With regard to each of the organic zone and the inorganic zone, if the compositional concentration changes through the thickness, they have a gradient delta associated. The gradient delta is the rate of change of the compositional constituents relative to each other with regard to the location within the layer. The greater the gradient delta, the greater the compositional change within a defined space or distance. Differing embodiments may have differing gradient deltas.

The interface zones are neither fully organic nor inorganic. The zones may not have distinct boundaries. In one embodiment, both the inorganic zone and the organic zone each have a corresponding gradient such that and the "hand-off" from the inorganic zone to the interface zone and then to the organic zone forms a seamless concentration gradient across, with no distinct boundary. In such an instance, only the inorganic zone has a portion that is greater than 90 percent devoid of the material that forms the other layer. Thus, the barrier coating may not have distinct interfaces at which the composition of the coating changes abruptly. It should also be noted that the composition of the barrier coating does not necessarily vary monotonically from one surface to the other surface thereof. A monotonically varying composition is only one case of barrier coating.

In one embodiment, the concentration gradient from the inorganic zone to the interface zone and then to the organic zone is not smooth, but is stepped with sudden and distinct changes in the compositional makeup with regard to at least one of the zone-to-zone transitions.

The barrier coating may have a low permeability to some or all reactive permeate materials. By low permeability with regard to oxygen it is meant that the permeability is less than about 0.1 cm$^3$/(m$^2$day), as measured at 25 degrees Celsius and with a gas containing 21 volume-percent oxygen. By low permeability with regard to water, the water vapor transmission is less than about $1 \times 10^{-2}$ g/(m$^2$day), as measured at 25 degrees Celsius and with a gas having 100-percent relative humidity. It is impractical to list the boundary terms for every contemplated reactive permeate. Thus, low permeability with regard to unspecified reactive permeate means that there is a reduction in the permeation rate of at least 90 percent for a barrier coated substrate relative to a same substrate, same permeate, and same conditions for an uncoated substrate.

In one embodiment, a substrate with a barrier coating has a light transmittance greater than 85% in a selected wavelength range between about 400 nanometers to about 700 nanometers.

Figure 3:
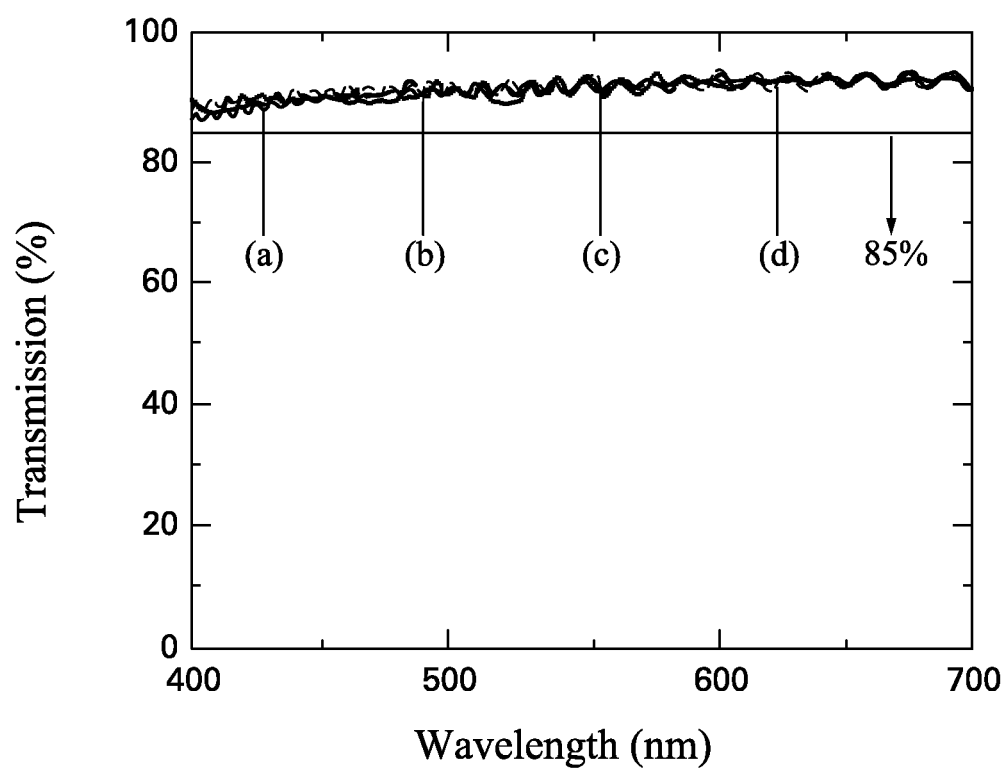
FIG. 3 shows light transmittance spectra for a barrier coating of an embodiment of the invention with a varying number of layers and varying layer thicknesses.

FIG. 3 shows transmission spectra for barrier coatings with varying number of layers and varying organic zone thickness. Transmission spectra for barrier coatings with 100 nanometer silicon oxycarbide organic zone disposed or sandwiched between two 30 nanometer silicon oxynitride inorganic zones (a), with 300 nanometer silicon oxycarbide organic zone between two 30 nanometer silicon oxynitride inorganic zones (b), with 600 nanometer silicon oxycarbide organic zone between two 30 nm silicon oxynitride inorganic zones (c) and with two 300 nanometer silicon oxycarbide organic zone alternating with three 30 nanometer silicon oxynitride inorganic zones (d), demonstrate that the transmission efficiency of the barrier coating is marginally or negligibly affected by increasing the number of zones, or by increasing thickness of the organic zones in the coating. Coatings with thick organic zones and with multiple zones may have good transmission efficiency. All barrier coatings in this example have 10 nanometer thick interface zones between the organic and inorganic zones.

Figure 4:
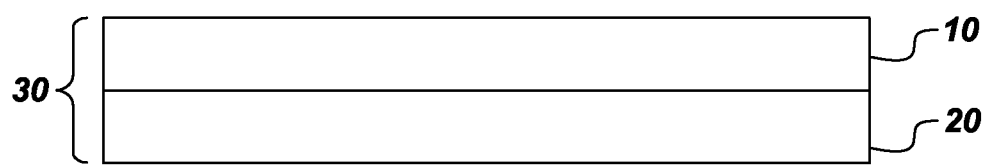
FIGS. 4-6 shows schematically embodiments of composite articles according to embodiments of the invention.
Figure 5:
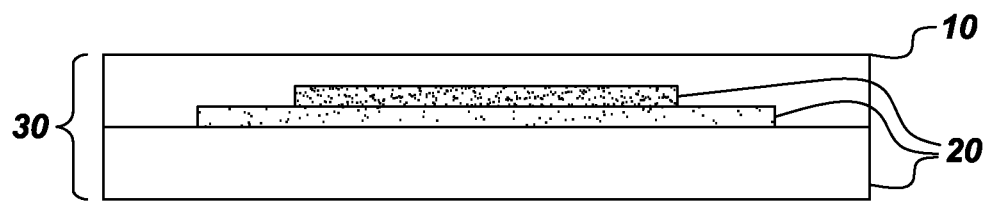
Figure 6:
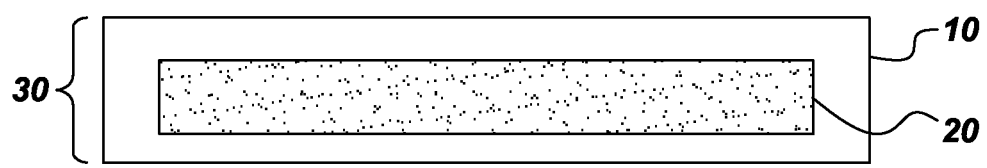

As shown in FIGS. 4-6, a composite article 30 has at least one barrier coating 10 disposed on at least one surface of a substrate 20.

Suitable coating compositions of regions across the thickness are organic, and inorganic materials, and organic/inorganic combinations. These materials may be reaction products or recombination products of plasma species as deposited onto the substrate surface.

Organic coating materials may include carbon, hydrogen, oxygen, and optionally other minor elements, such as sulfur, nitrogen, silicon, and the like. Suitable reactants may include straight or branched alkanes, alkenes, alkynes, alcohols, aldehydes, ethers, alkylene oxides, ketones, or aromatics. Suitable ketones may include methyl ethyl ketone. These reactants may have up to 15 carbon atoms.

Applying a ceramic precursor to the surface of interest can form the inorganic zone. Suitable inorganic coating materials may include elements of Groups IIA, IIIA, IVA, VA, VIA, VIIA, IB, and IIB. Other suitable inorganic coating materials may include metals of Groups IIIB, IVB, and VB. Other suitable inorganic coating materials may include rare-earth metals. In one embodiment, the inorganic zone includes one or more metal selected from aluminum, silicon, zinc, indium, tin, lanthanum, cerium, praseodymium, neodymium, promethium, samarium, europium, gadolinium, terbium, dysprosium, holmium, erbium, thulium, ytterbium, lutetium, indium, scandium, yttrium, zirconium, hafnium, or titanium. In one embodiment, the inorganic zone includes one or more transition metal. The inorganic coating materials may be in the form of a metal boride; carbide; nitride; oxide; phosphide; or silicide; or, a combination of two or more of the foregoing. In one embodiment, the inorganic zone comprises one or more of silicon carbide, silicon oxycarbide, silicon nitride, or aluminum oxycarbonitride.

A suitable plasma for creating the inorganic zone can be generated from an inorganic precursor, with or without the presence of argon, helium, neon, xenon, nitrogen or oxygen. Suitable precursors may include aluminum tartrate, ammonia, silane, and silicone. Suitable material for use as a precursor may include one or more of polycarbosilane, hydridopolycarbosilane, polyhydridosilane, polyhyridosilazane, polysiloxane, polysesquilsiloxane, propylene oxide, vinyl trimethylsilane (VTMS), tetraethoxysilane (TEOS), hexamethyldisiloxane (HMDSO), hexamethyldisilazane (HMDSN), or octamethylcyclotetrasiloxane (D4). If a carbide component is desired the organic may be supplied in the form of methane or xylene. Other combinations of reactants may be chosen to obtain a desired coating composition. A mixed composition of the coating is obtained by changing the compositions of the reactants fed into the reactor chamber during the deposition of reaction products to form the coating.

In one embodiment, a composite article, at least one element is an optoelectronic element. A suitable optoelectronic element is an organic element that may be an electroluminescent element. Another suitable optoelectronic element is a photoresponsive element. In one embodiment, a composite article includes a polymeric substrate and an active element that is an organic electroluminescent element.

The composite article may include one or more additional elements. These additional element may include an adhesion layer, abrasion resistant layer, chemically resistant layer, photoluminescent layer radiation-absorbing layer, radiation reflective layer, conductive layer, electrode layer, electron transport layer, hole transport layer, and charge blocking layer.

Another aspect of the invention is a method for depositing the barrier coating. The method includes providing at least one substrate surface for deposition. The substrate surface optionally may be prepared by forming a primer layer, planarizing layer, adhesion or tie layer, or the like. A tie layer may include compositions that are found within both the substrate and the barrier coating. The method may continue by depositing reaction or recombination products of reacting species on the surface (or the prepared substrate surface); and, changing the compositions of the reactants or precursors fed into the reactor chamber during the deposition. Changing the compositions (or the ratio of fed reactant compositions) forms the barrier coating with at least one organic zone and at least one inorganic zone. Selecting the reactants or precursors, the time or amount of deposition, and the reactant or precursor ratio controls the refractive index. That is, if the refractive indices of the materials (generally an inherent property) differ, the mere change of material composition from zone to zone may result in a corresponding change in refractive index from zone to zone. Accordingly, affecting the thickness, the deposition parameters, and the like may align the refractive indices with each other. In one embodiment, the factor selection may provide an about uniform refractive index along an axis of light transmission through the barrier coating.

A bulk material or a substrate having a surface suitable for deposition may be a single piece, monolith, or a structure. Other suitable substrates may include a plurality of adjacent layers or regions of differing finishes, structures, and materials. Non-limiting examples of a substrate include a rigid transparent glass, a rigid polymeric substrate, and a flexible polymeric substrate.

Suitable substrate materials may include organic polymeric materials. Suitable polymeric materials may include polyacrylate; polycarbonate; silicone; epoxy resin; silicone-functionalized epoxy resin; and polyester. Suitable polyesters may include MYLAR (made by E.I. du Pont de Nemours & Co.). Suitable polyimide may include KAPTON H or KAPTON E (made by du Pont). Other commercially available suitable polymeric materials may include APICAL AV (made by Kanegafugi Chemical Industry Company); UPILEX (made by UBE Industries, Ltd.); polyethersulfone ("PES," made by Sumitomo); and polyetherimide such as ULTEM (made by General Electric Company). Other suitable polymeric materials may include polyolefins and polyolefin derivatives, such as polyethylene terephthalate ("PET") and polyethylene naphthalene ("PEN");

The barrier coating can be formed using plasma-enhanced chemical-vapor deposition, radio-frequency plasma-enhanced chemical-vapor deposition, microwave plasma enhanced chemical vapor deposition, expanding thermal-plasma chemical-vapor deposition, sputtering, reactive sputtering, electron-cyclotron-resonance plasma-enhanced chemical-vapor deposition, or inductively-coupled plasma-enhanced chemical-vapor deposition.

The relative supply rates of reactant gases are controlled during deposition to affect the composition of the deposited material forming a zone as the barrier coating is built. If oxygen is used as an additional precursor gas, and the mole fraction of oxygen in the feed gas is increased from zero, the material deposited on the surface may change from a metal pnictide to a metal oxypnictide. For example, the change may be from silicon nitride to silicon oxynitride. As the oxygen mole fraction in the reactant gas increases, oxygen starts to replace nitrogen in the deposited material. The same effect extends to other compositions, such as carbides, borides, silicides, and the like. Compositional and structural changes occur with increase in oxygen mole fraction, resulting in refractive index modification as well. Varying the mole fraction of a constituent reactant in the precursor, as noted above, may control refractive index modification to allow for reactive index matching.

Figure 7:
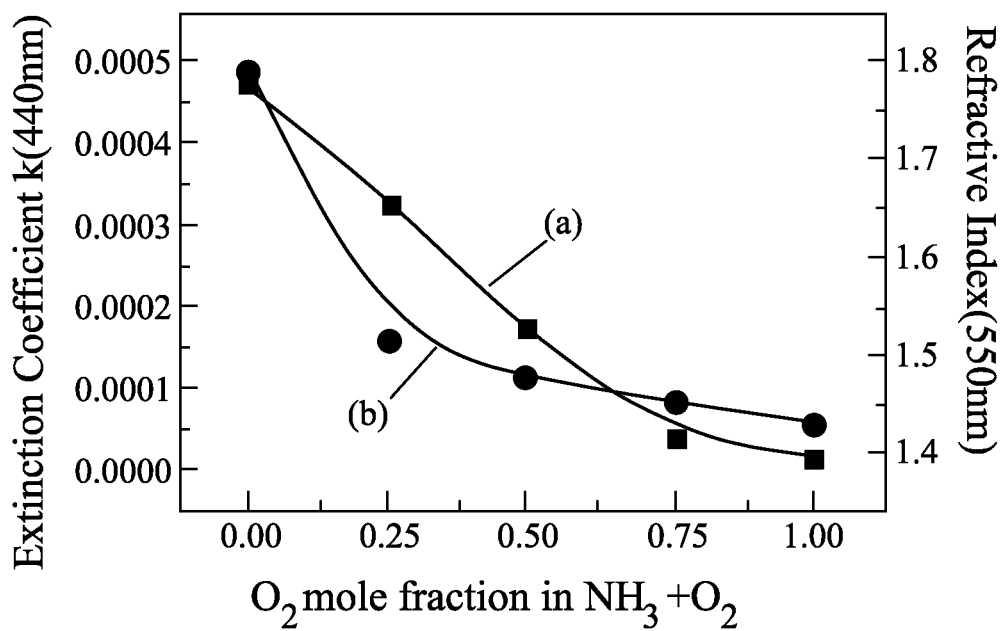
FIG. 7 shows variation in refractive index and extinction coefficient with variation in oxygen mole fraction in precursor feed gas during deposition.

FIG. 7 shows the variation of refractive index with variation in oxygen mole fraction, for a precursor composition including, ammonia and oxygen. For example, if the organic zone of silicon oxycarbide having a refractive index at 550 nanometers of about 1.5 is used in the coating, then a inorganic zone of silicon oxynitride, at an oxygen mole fraction of about 0.25, is also deposited such that the refractive index of the inorganic zone matches the refractive index of the organic zone of silicon oxycarbide, resulting in a barrier coating with uniform refractive index.

With further reference to FIG. 7, measured optical properties are obtained by spectroscopic ellipsometry, refractive index (a) and extinction coefficient (b), of inorganic zones deposited with varying oxygen mole fraction. In this example, depending on the oxygen mole fraction in the precursor feed gases, refractive index of the depositing inorganic material varies from 1.8 to 1.4. Thus, by selecting a process condition, which results in refractive index of depositing inorganic material close to that of organic material, the interference amplitude can be reduced significantly. FIG. 7 also indicates that the extinction coefficient (b) does not change enough to significantly affect the absorption of light through the inorganic zones for thicknesses of inorganic zones used in this invention.

Figure 8:
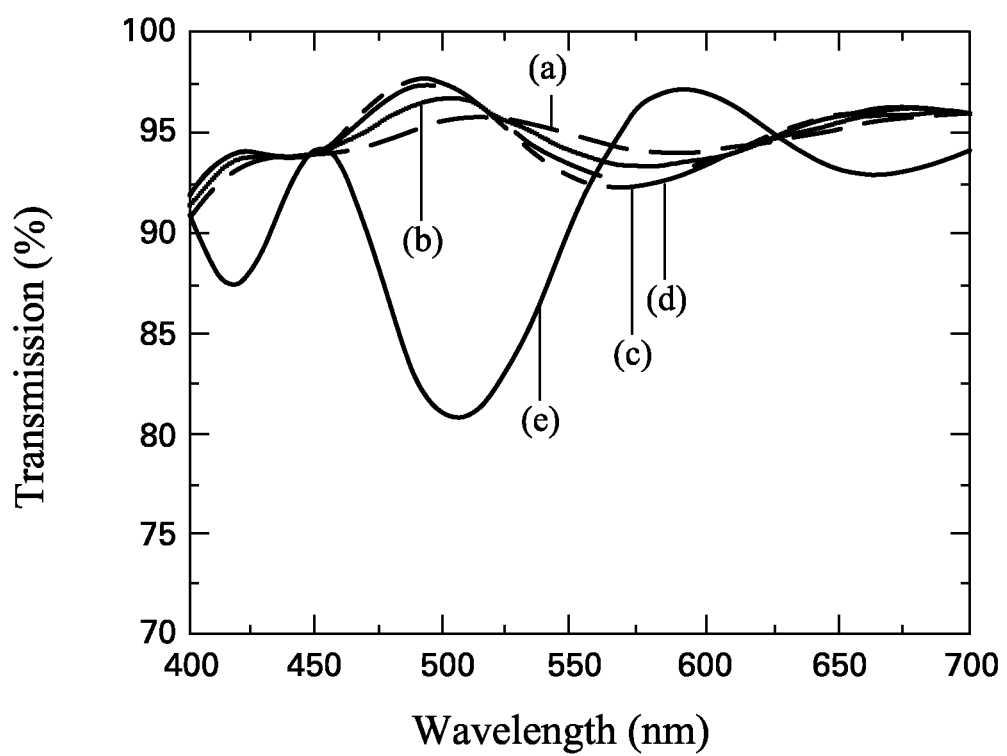
FIG. 8 shows calculated visible light transmittance spectra as a function of oxygen mole fraction in feed gas during deposition.

FIG. 8 shows visible light transmittance spectra through the barrier coating for different oxygen mole fractions of 0.0 (a), 0.25 (b), 0.5 (c), 0.75, (d) and 1.0 (e) in precursor feed gas calculated using measured optical properties such as refractive index n and extinction coefficient k. In this example, visible light transmittance with minimum interference fringes are achieved at about 0.25 oxygen mole fraction indicating that the refractive index of the inorganic material deposited under this process condition matches the refractive index of the organic material deposited.

As noted above, in one embodiment, a substrate transitional region or interface zone exists between the substrate and the barrier coating. A substrate interface zone may have a graduated change of the bulk composition of the substrate to the composition of the contacting barrier coating portion. Such a transition may reduce impact of an abrupt change in the composition. The transition may mitigate a chance for delamination of the barrier coating. A gradual change of the coating composition may be achieved by the gradual change of the precursor composition during formation. In one embodiment, the transition may be formed by substrate surface pre-treatment that enhances diffusion of precursor into the substrate during formation.

A further aspect of the invention relates to a device assembly. The assembly includes a device, at least one surface of which is coated with at least one barrier coating, the composition of which varies across the thickness of the coating and has uniform refractive index along the axis of light transmission. Such device assemblies may include liquid crystal displays, light emitting devices, photo-responsive devices, integrated circuits and components of medical diagnostic systems.

The device assembly may include a device disposed on a flexible and transparent substrate. The substrate has a first substrate surface and a second substrate surface. The substrate surface is coated with the barrier coating. The barrier coating may be robust protection against environmentally active species, having desirable optical properties and may be mass-produced. The deposition method enables concurrent control of optical and diffusion properties of barrier coatings by adjusting the deposition parameters. The barrier coatings may be useful in optical and optoelectronic devices, such as organic light-emitting devices and organic photovoltaic devices.

Light emitting and light absorbing materials and electrode materials in optoelectronic devices may be susceptible to attack by reactive species existing in the environment, such as oxygen and water vapor. Additionally, surface defects such as spikes and point defects on substrates or other functional layers could affect the performance of these devices.

One aspect of this invention is a composite article comprising a barrier coating and a planarizing layer. The planarizing layer is disposed between the barrier coating and the substrate.

The planarizing layer thickness may be greater than 1 nanometer in one embodiment; and in another embodiment, the planarizing layer thickness may be less than about 100 micrometers. In one embodiment, the thickness may be in a range of from about 1 nanometer to about 100 nanometers, from about 100 nanometers to about 1000 nanometers, from about 1 micrometer to about 10 micrometers, or from about 10 micrometers to about 100 micrometers. Planarizing layer thickness may be selected based on the surface roughness of the substrate surface, and the need for a compliant and good-bonding surface.

In one embodiment, the planarizing layer may be formed from a resin. A suitable resin may include an epoxy-based resin or an acrylic based resin. Some epoxies impart increased surface durability, for example, increased resistance to scratch and damage that may happen during fabrication or transportation. Siloxane portions of certain diepoxies may be adjusted in length and branching to optimize desired properties. Non-limiting examples of suitable resins may include cycloaliphatic epoxy resins, such as Dow ERL4221, ERL4299, ERLX4360, UVR600 and Silar Labs' PRODUCT 2283—cycloaliphatic diepoxy disiloxane.

Additives can be incorporated into the planarizing layer to tailor its properties. For example, a UV catalyst may be added to the layer composition. In another example, UV absorbers can be added to protect underlying UV sensitive layers. Siloxane additives can be included to make the leveling layer more scratch resistant. Antioxidant chemicals such as Ciba Geigy's IRGANOX hindered amine complexes can be added to prevent yellowing of the coating and underlying substrate.

Other additives may be added to the planarizing layer. These other additives may include a flexibilizing agent, adhesion promoter, surfactant or catalyst and combinations thereof. A flexibilizing agent helps make the planarizing layer less brittle, more flexible. The flex modification may aid in reducing cracking or peeling and may reduce the stress the coating applies to the underlying element or substrate. An adhesion promoter may improve adhesion between the substrate on the coating. For example, an adhesion promoter such as an organic silane-coupling agent binds to a surface of a substrate or element and also to the subsequent film applied over the substrate or element. A surfactant helps lower the surface energy of the coating, allowing it to wet a substrate or element, and level better, providing a smoother, more uniform coating. Non-limiting examples of UV curing agents are Dow UVI-6976, UVI-6992 Ciba IRGACURE 250, and GE UV9380C. Non-limiting examples of UV sensitizers are isopropyl thioxanthone and ethyl dimethoxy anthracene. Non-limiting examples of thermal catalysts are King Industries CXC-162, CXC-1614, XC-B220 and 3M FC520. Non-limiting examples of surfactants are GE SILWET 7001, 7604 GE SF1188A, SF1288, SF1488, BYK-Chemie BYK307 and Dow TRITON X. Non-limiting examples of flexiblizing agents are Dow DER 732 and 736, cyclohexane dimethanol, Celanese TCD alcohol DM, and King Industries KFLEX 148 and 188. Non-limiting examples of other additives include anti-oxidants such as Ciba IRGANOX, UV absorbers such as Ciba TINUVIN and leveling agents such as BYK-Chemie BYK-361.

The planarizing layer composition may be curable, and may be cured. The curing may be performed using radiation curing or thermal curing. The radiation curing may be ultraviolet curing, microwave curing, radio frequency curing, electron beam curing, or the like. Other curing mechanisms, including anhydride or amine curing, can be employed.

The barrier coating outward-facing surface may be smooth and defect free. According to one embodiment the barrier coating may have an average surface roughness $R_a$ of less than about 4 nanometers and a peak surface roughness $R_p$ of less than about 10 nanometers. In one embodiment the $R_a$ is in a range of from about 4 nanometers to about 3 nanometers, from about 3 nanometers to about 2 nanometers, from about 2 nanometers to about 1 nanometer, or from about 1 nanometer to about 0.5 nanometers. In one embodiment the $R_p$ is in a range of from about 10 nanometers to about 8 nanometers, from about 8 nanometers to about 6 nanometers, from about 6 nanometers to about 4 nanometers, from about 4 nanometers to about 3 nanometers, or less than about 3 nanometers. The barrier coating may have a number of point defects that is less than about $100/mm^2$. In one embodiment, the defect rate may be in a range of from about $100/mm^2$ to about $10/mm^2$, or from about $10/mm^2$ to about $1/mm^2$.

Figure 9:
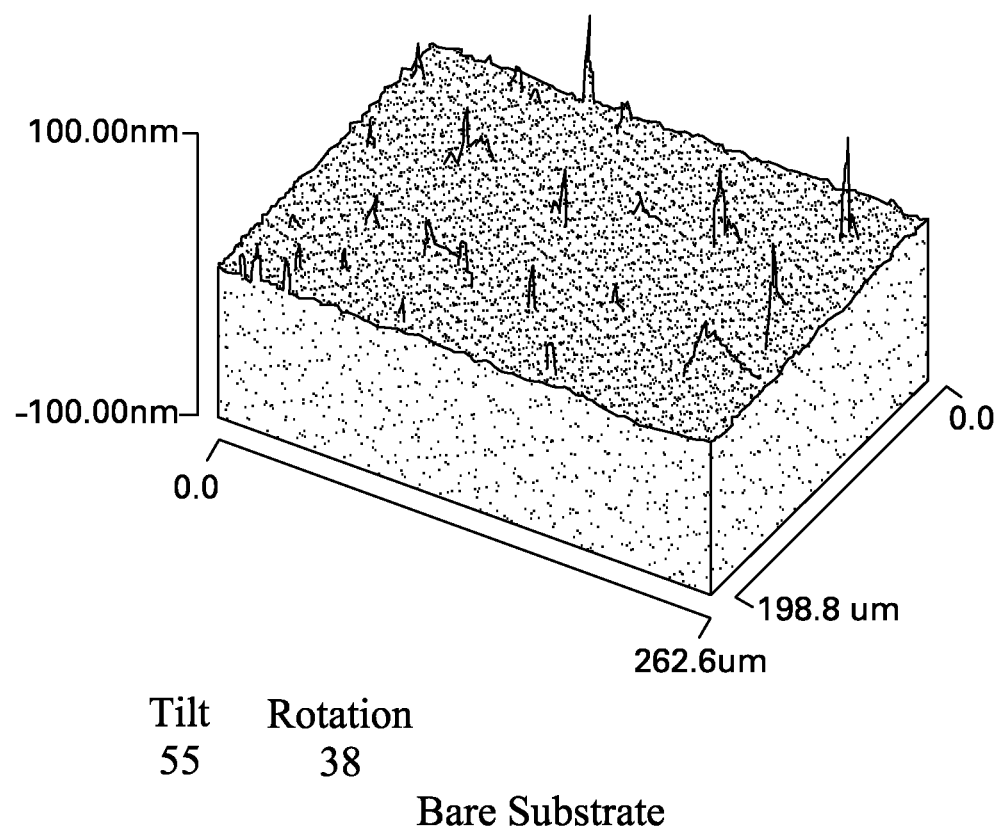
FIG. 9 shows a perspective view of a portion of a bare substrate obtained using optical profilometry.
Figure 10:
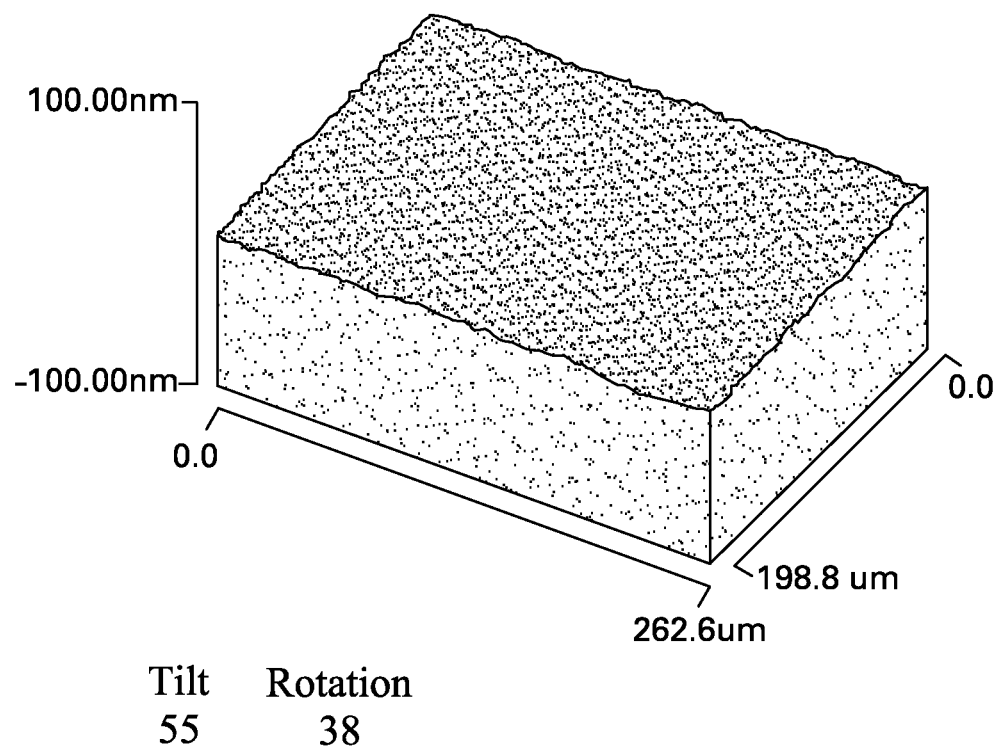
FIG. 10 shows a perspective view of a portion of a substrate with a planarizing layer obtained using optical profilometry.
Figure 11:
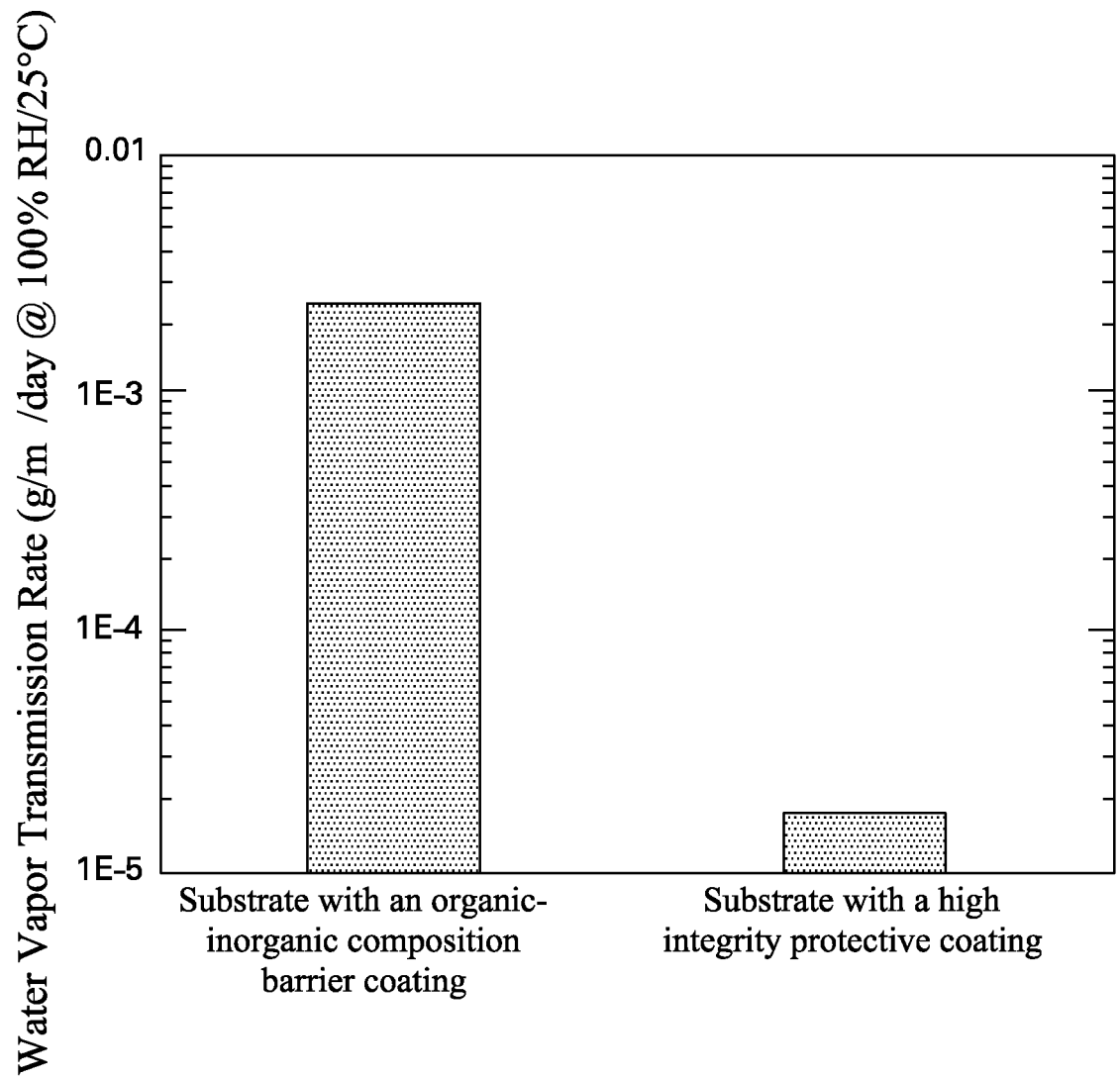
FIG. 11 graphically shows water vapor transmittance rate (WVTR) through identical substrates (a) with a barrier coating and (b) with a barrier coating in accordance with one aspect of the invention.

FIG. 9 shows an optical profilometry plot of a bare substrate surface and FIG. 10 shows an optical profilometry plot of a substrate surface with a planarizing layer in accordance with one aspect of the invention. FIG. 11 graphically shows water vapor transmittance rate (WVTR) through identical substrates (a) without a barrier coating and (b) with a barrier coating in accordance with one aspect of the invention. The WVTR measurements shown in FIG. 11 are obtained using a system with a detection limit of low $1 \times 10^{-6}$ g/(m²day). FIG. 11 shows that a substrate with a barrier coating and a planarizing layer has a lower WVTR than a similar substrate with only an organic-inorganic composition barrier layer coating.

Figure 12:
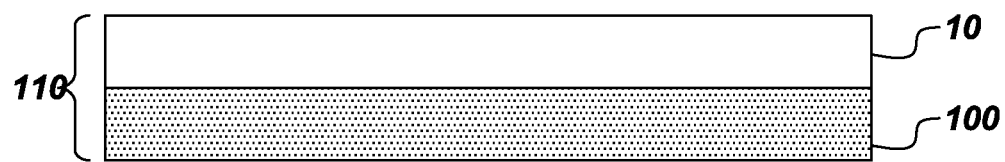
FIGS. 12-15 show schematically embodiments of composite articles according to embodiments of the invention.
Figure 13:
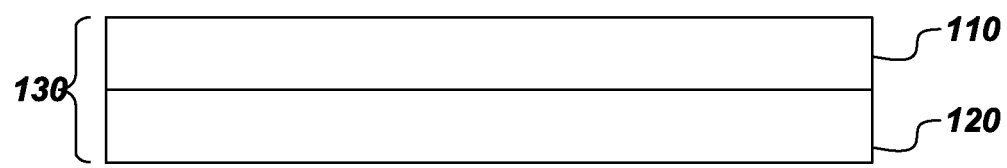
Figure 14:
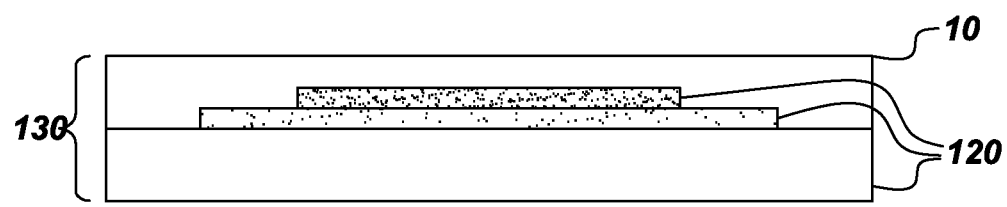
Figure 15:
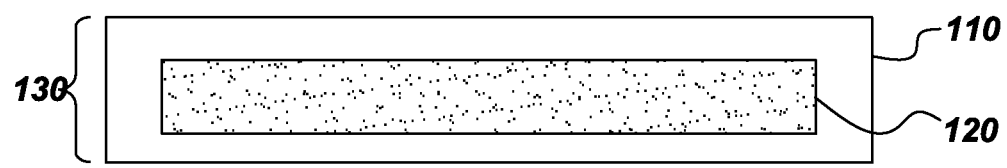

FIG. 12 shows schematically a barrier coating in accordance with one aspect of the invention. As shown in FIG. 13, a barrier coating 110 is disposed on a surface of a substrate 120 of the composite article 130. In FIG. 14, a barrier coating 110 is disposed on a surface of more than one substrate 120 of the composite article. In FIG. 15, a barrier coating 110 encapsulates a substrate 120 of the composite article 130.

Depending on the end use, the substrate can be transparent or opaque, rigid or flexible. The barrier coating may provide mechanical protection to underlying substrate, embedded elements, and coatings.

As noted above, the barrier coating may reduce the apparent surface roughness, for example, of high glass transition temperature (Tg) polycarbonates. The average apparent surface roughness can be less than about 0.75 nanometers and average apparent peak surface roughness can be less than about 5.5 nanometers. And, the barrier coating may reduce the surface defect density to a number of point defects that is less than about $100/mm^2$.

Additional functional coatings can be deposited on top of the barrier coating. The barrier coating can be used as an etch-stop layer for conductive coatings such as indium tin oxide coatings. The planarizing layer may be used as an interlayer between two barrier coatings. The barrier coating can be used to release the stress between a top inorganic zone and bottom plastic substrate. The other side of a substrate with a barrier coating can be coated with the same or different coating to balance the stress brought by adding of coating.

A composite article may include a polymeric substrate and an active element. In one embodiment, the active element may be an optoelectronic element. The optoelectronic element may be an organic element. In a further embodiment, the optoelectronic element is an electroluminescent element. The active element may be an organic electroluminescent element. The optoelectronic element may be a photoresponsive element. A bulk material or a substrate having a surface for deposition may be a single piece or a structure comprising a plurality of adjacent pieces of different materials.

The barrier coating may be deposited onto a substrate surface prepared by adding a planarizing layer. The depositing method may include preparing a homogenous, resin-based planarizing layer composition. The planarizing layer composition may be deposited on the surface and cured. The deposition of a planarizing layer can be either a batch mode process or a roll-to-roll mode process. The process can be selected from reverse roll coating, wire-wound or Mayer rod coating, direct and offset gravure coating, slot die coating, blade coating, hot melt coating, curtain coating, knife over roll coating, extrusion, air knife coating, spray, rotary screen coating, multilayer slide coating, coextrusion, meniscus coating, comma and microgravure coating, spin coating, dip coating, lithographic process, langmuir process and flash evaporation. The planarizing layer composition may include at least one resin, which may be epoxy-based or an acrylic based resin. The method may include adding at least one flexibilizing agent, adhesive agent, surfactant or catalyst or combinations thereof in the planarizing layer composition.

The planarizing layer composition may be cured. The curing may be radiation curing or thermal curing. The radiation curing may be ultraviolet curing. The method includes depositing reaction or recombination products of reacting species on the planarizing layer, and changing the composition of the reactants fed into the reactor chamber during deposition to form a barrier coating layer.

The barrier coating layer may be formed by one of many deposition techniques, such as plasma-enhanced chemical-vapor deposition ("PECVD"), radio-frequency plasma-enhanced chemical-vapor deposition ("RFPECVD"), expanding thermal-plasma chemical-vapor deposition ("ETPCVD"), sputtering including reactive sputtering, electron-cyclotron-resonance plasma-enhanced chemical-vapor deposition (ECRPECVD"), inductively coupled plasma-enhanced chemical-vapor deposition ("ICPECVD"), or combinations thereof.

EXAMPLE 1

A first planarizing composition is formed by adding 100 parts by weight liquid cycloaliphatic diepoxide (Dow Chemical ERL4221d), 1 part by weight OCTACAT UV sensitive catalyst (General Electric UV9392C) and 0.15 parts by weight of a surfactant (3M FLUORAD FC430) together and blending. The resulting blend is filtered through a 1 micrometer filter, degassed and applied to a plastic substrate by spin coating. Immediately after coating, the uncured planarizing layer is exposed to a mercury arc lamp broadband UV source for 30 seconds to activate the catalyst. The part is baked in an oven at 125 degrees Celsius for 1 hour to complete the cure of the epoxy resin. A barrier coating is deposited over the planarizing layer.

EXAMPLE 2

A second planarizing composition is formed by blending: a siloxane containing epoxy form Silar Labs Product 2283 (cycloaliphatic epoxy disiloxane), OCTACAT UV sensitive catalyst (General Electric UV9392C) and a surfactant (3M FLUORAD FC430) to form a blend. The blend is filtered through a 1 micrometer filter, degassed and applied to a plastic substrate by spin coating. Immediately after coating, the uncured planarizing layer is exposed to a mercury arc lamp broadband UV source for 30 seconds to activate the catalyst. The part is baked in an oven to complete the cure of the epoxy resin. A barrier coating is deposited over the planarizing layer.

EXAMPLE 3

The barrier-coated substrate from Example 1 is coated with a transparent conductive coating comprising tin doped indium oxide (ITO). The transparent conductive coating adheres to the barrier-coated substrate.

The embodiments described herein are examples of compositions, structures, systems and methods having elements corresponding to the elements of the invention recited in the claims. This written description may enable those of ordinary skill in the art to make and use embodiments having alternative elements that likewise correspond to the elements of the invention recited in the claims. The scope of the invention thus includes compositions, structures, systems and methods that do not differ from the literal language of the claims, and further includes other structures, systems and methods with insubstantial differences from the literal language of the claims. While only certain features and embodiments have been illustrated and described herein, many modifications and changes may occur to one of ordinary skill in the relevant art. The appended claims cover all such modifications and changes.

The invention claimed is:

1. A composite article comprising:
a substrate; and
a barrier coating secured to a surface of the substrate, and the barrier coating comprising a single layer comprising a transitional interface zone between an organic zone and an inorganic zone, wherein each of the transitional interface zone, the organic zone and the inorganic zone comprises no distinct boundary, and wherein the inorganic zone comprises one or more transition metals.

2. The composite article as defined in claim 1, wherein the barrier coating has an outward facing surface with an $R_a$ value that is less than about 4 nanometers.

3. The composite article as defined in claim 1, wherein the barrier coating has an outward facing surface with an $R_p$ value less than about 5.5 nanometers.

4. The composite article as defined in claim 1, wherein the barrier coating has an oxygen transmission rate of less than about 0.1 cm$^3$/(m$^2$ day), as measured at 25 degrees Celsius when in contact with a gas containing 21 volume-percent oxygen.

5. The composite article as defined in claim 1, wherein the barrier coating has water vapor transmission rate of less than about $1 \times 10^{-2}$ g/(m$^2$ day), as measured at 25 degrees Celsius when in contact with a gas having 100-percent relative humidity.

6. The composite article as defined in claim 1, wherein the barrier coating has a light transmittance greater than 85 percent in a wavelength range of from about 400 nanometers to about 700 nanometers.

7. The composite article as defined in claim 1, wherein the substrate is a flat, planar surface comprising polycarbonate, polyester, or polyolefin.

8. The composite article as defined in claim 1, further comprising an optoelectronic element on the surface of the substrate.

9. The composite article as defined in claim 8, wherein the barrier coating overlays and protects the optoelectronic element.

10. The composite article as defined in claim 8, wherein the optoelectronic element is electroluminescent.

11. The composite article as defined in claim 8, wherein the optoelectronic element is an organic light emitting diode.

12. The composite article as defined in claim 8, wherein the optoelectronic element is photoresponsive.

13. The composite article as defined in claim 1, further comprising a planarizing layer secured to the surface of the substrate and to the barrier coating.

14. The composite article as defined in claim 13, wherein the planarizing layer has a thickness that is less than 25 micrometers.

15. The composite article as defined in claim 1, wherein the interface zone has a thickness that is greater than about 5 nanometers.

16. The composite article as defined in claim 1, wherein the interface zone has a thickness that is less than about 100 nanometers.

17. The composite article as defined in claim 1, wherein the inorganic zone has a thickness that is less than about 100 nanometers.

18. The composite article as defined in claim 17, wherein the inorganic zone has a thickness that is less than about 50 nanometers.

19. The composite article as defined in claim 1, wherein the inorganic zone has a thickness that is greater than about 10 nanometers.

20. The composite article as defined in claim 1, wherein the organic zone has a thickness that is less than about 1 micrometer.

21. The composite article as defined in claim 1, wherein the organic zone has a thickness that is greater than about 100 nanometers.

22. The composite article as defined in claim 1, wherein the organic zone has a thickness that is in a ratio with a thickness of the inorganic zone, and the ratio is less than 10:1.

23. The composite article as defined in claim 1, wherein the inorganic zone is of uniform composition across the thickness of the inorganic zone.

24. The composite article as defined in claim 1, wherein the inorganic zone or the organic zone comprises a composition having two or more components, the component concentration of which varies across the thickness of the respective layer to define a compositional gradient.

25. The composite article as defined in claim 24, wherein the compositional gradient extends across the entire thickness of the respective layer.

26. The composite article as defined in claim 25, wherein the compositional gradient extends across the entire thickness of the respective layer to seamlessly merge with the interface zone.

27. A composite article comprising:
a substrate; and
a barrier coating secured to a surface of the substrate, and the barrier coating comprising a single layer comprising a transitional interface zone between an organic zone and an inorganic zone, wherein each of the transitional interface zone, the organic zone and the inorganic zone comprises no distinct boundary, wherein the inorganic zone comprises a metal selected from the group consisting of aluminum, cerium, dysprosium, erbium, europium, gadolinium, hafnium, holmium, indium, lanthanum, lutetium, neodymium, promethium, praseodymium, samarium, scandium, thulium, tin, terbium, titanium, yttrium, ytterbium, zinc, and zirconium.

28. A device assembly, comprising:
a substrate;
an optoelectronic element disposed on a surface of the substrate; and
a barrier coating disposed directly on the surface of the substrate and overlaying the optoelectronic element, wherein the barrier coating comprises:
an organic zone;
an inorganic zone comprises a metal selected from the group consisting of aluminum, cerium, dysprosium, erbium, europium, gadolinium, hafnium, holmium, indium, lanthanum, lutetium, neodymium, promethium, praseodymium, samarium, scandium, thulium, tin, terbium, titanium, yttrium, ytterbium, zinc, and zirconium; and
an interface zone between the organic zone and the inorganic zone wherein the barrier coating comprises a single layer, and wherein each of the organic zone, the inorganic zone and interface zone comprises no distinct boundary.

29. The device assembly of claim 28, wherein the inorganic zone comprises one or more transition metals.

* * * * *